United States Patent
Tanaka et al.

(10) Patent No.: US 6,617,701 B2
(45) Date of Patent: Sep. 9, 2003

(54) EPOXY RESIN COMPOSITION TO SEAL SEMICONDUCTORS AND RESIN-SEALED SEMICONDUCTOR DEVICE

(75) Inventors: Masayuki Tanaka, Nagoya (JP); Yumiko Tsurumi, Kawasaki (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 09/804,715

(22) Filed: Mar. 13, 2001

(65) Prior Publication Data

US 2002/0014706 A1 Feb. 7, 2002

Related U.S. Application Data (62) Division of application No. 09/008,801, filed on Jan. 20, 1998, now Pat. No. 6,214,904.

(30) Foreign Application Priority Data

Jan. 23, 1997 (JP) .............................................. 9-010721

(51) Int. Cl.[7] .............................................. H01L 23/29
(52) U.S. Cl. ...................... 257/789; 257/788; 257/787; 257/795
(58) Field of Search ................................ 257/787, 788, 257/795, 789; 528/86, 87, 96, 97; 523/400, 443; 101/453

(56) References Cited

U.S. PATENT DOCUMENTS

| | | | |
|---|---|---|---|
| 4,728,681 A | | 3/1988 | Kobayashi et al. |
| 5,216,077 A | | 6/1993 | Yoshizumi et al. |
| 5,417,164 A | * | 5/1995 | Nishida et al. ............. 101/453 |
| 5,418,266 A | * | 5/1995 | Shiobara et al. ............ 523/443 |
| 5,565,709 A | * | 10/1996 | Fukushima et al. ......... 257/787 |
| 5,643,975 A | * | 7/1997 | Shiobara et al. ............ 523/400 |
| 6,037,425 A | | 3/2000 | Fukuzawa et al. |

FOREIGN PATENT DOCUMENTS

| | | |
|---|---|---|
| DE | 44 08 176 A1 | 9/1995 |
| EP | 0 511 833 A2 | 11/1992 |
| EP | 0 676 806 A2 | 10/1995 |
| EP | 0 749 996 A1 | 12/1996 |
| EP | 0 751 561 A1 | 1/1997 |

OTHER PUBLICATIONS

Rehme, F. et al. "Chipgehäuse Im Werkstofftest" F & M Feinwerktechnik Mikrotechnik Messtechnik, vol. 103, No. 7/08, Aug. 1, 1995, pp. 425–428, XP000524175.

Robinson, D. et al. "Glob Top Encapsulation of Large Die on MCM–L" International Journal of Microcircuits and Electronic Packaging, vol. 15, No. 4, Jan. 1, 1992, pp. 213–228, XP000303596.

* cited by examiner

Primary Examiner—Tom Thomas
Assistant Examiner—Douglas W. Owens
(74) Attorney, Agent, or Firm—Piper Rudnick LLP (57) ABSTRACT

An epoxy resin composition to seal semiconductors constructed of a semiconductor element, a base to support said semiconductor element, and an epoxy resin composition covering only one side opposite to the base, said epoxy resin composition comprising (A) epoxy resin, (B) hardener, and (C) inorganic filler, and giving a cured product which has (a) a flexural modulus of elasticity of 10 to 30 GPa at 23° C. and (b) a coefficient of linear expansion of $4\times10^{-6}$/K to $10\times10^{-6}$/K in the temperature range from 23° C. to the glass transition point, with the product of (a) and (b) being smaller than $2\times10^{-4}$ GPa/K.

11 Claims, 1 Drawing Sheet

EPOXY RESIN COMPOSITION TO SEAL SEMICONDUCTORS AND RESIN-SEALED SEMICONDUCTOR DEVICE

This application is a divisional of application Ser. No. 09/008,801, filed Jan. 20, 1998 U.S. Pat. No. 6,214,904, incorporated herein by reference.

BACKGROUND OF THE INVENTION

The present invention relates to a resin-sealed semiconductor device, especially a semiconductor device sealed with a resin covering only one side opposite to the base. More particularly, the present invention relates to a semiconductor device characterized by its sealing resin.

The recent downsizing and miniaturization of electronic machines and equipment is accompanied by semiconductors having reduced size and thickness and improved performance. The conventional semiconductor device is composed of a semiconductor element and a lead frame which are sealed by resin such that both sides thereof are covered except for those parts by which it is mounted on a printed circuit board. Therefore, the miniaturization of semiconductor device itself needs improvement in lead frame (as the base) and sealing resin. As the result, there have been developed TSOP (thin small outline package) and QFP (quad flat package), the former having sealing resin in reduced volume and thickness, the latter having a large number of pins.

In order to reduce the mounting area and to improve the performance, there has been developed a new semiconductor device constructed such that terminals to connect the semiconductor device to the mother board are arranged on the back of the base of the semiconductor device. Unfortunately, this structure has the disadvantage that the semiconductor device is liable to warp because only one side opposite to the base is covered with the sealing resin, unlike the conventional semiconductor device which has both sides thereof covered with the sealing resin. Warping hampers the mounting on a flat mother board, causes peeling at the interface between the base and the semiconductor element, and leads to failure in the thermal cycle test and popcorn resistance test.

SUMMARY OF THE INVENTION

It is an object of the present invention to provide an epoxy resin composition and a semiconductor device sealed therewith. Said epoxy resin composition exhibits good adhesiveness, hardly warps the semiconductor device, and gives good results in the thermal cycle test and popcorn resistance test, when it is applied to the semiconductor device constructed such that only one side opposite to the base is covered with a sealing resin unlike conventional semiconductor devices.

The present inventors completed this invention as the result of their extensive studies on the semiconductor device sealed with a resin covering only one side opposite to the base, for its improvement in resin adhesion, warp reduction, and thermal cycle properties and popcorn resistance. The gist of the present invention resides in an epoxy resin composition to seal semiconductors constructed of a semiconductor element, a base to support said semiconductor element, and an epoxy resin composition covering only one side opposite to the base, said epoxy resin comprising (A) epoxy resin, (B) hardener, and (C) inorganic filler, and giving a cured product which has (a) a flexural modulus of elasticity of 10 to 30 GPa at 23° C. and (b) a coefficient of linear expansion of $4 \times 10^{-6}$/K to $10 \times 10^{-6}$/K in the temperature range from 23° C. to the glass transition point, with the product of (a) and (b) being smaller than $2 \times 10^{-4}$ GPa/K.

DESCRIPTION OF THE PREFERRED EMBODIMENTS

Figure 1:
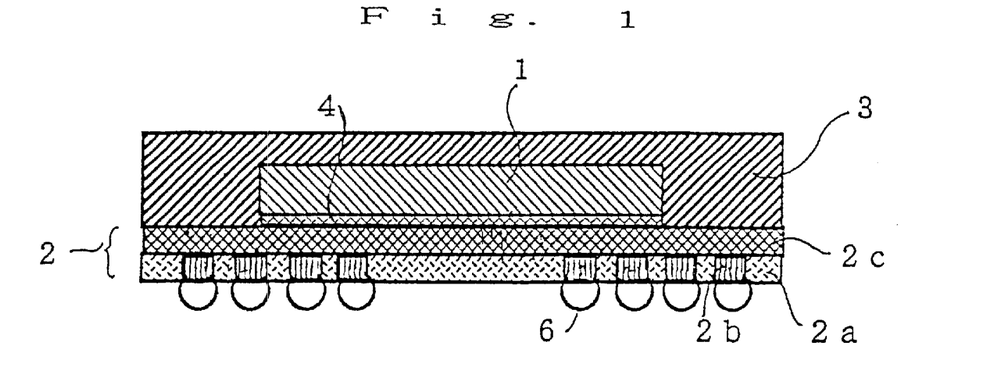
FIG. 1 is a schematic sectional view showing a semiconductor device pertaining to one embodiment of the present invention.
Figure 2:
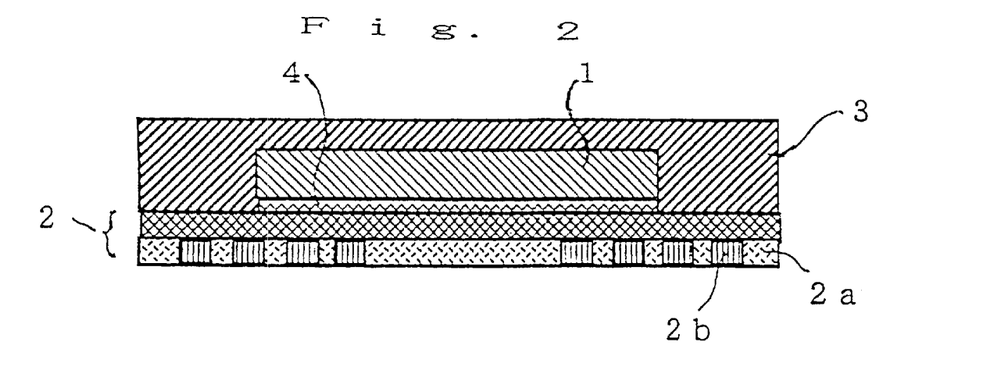
FIG. 2 is a schematic sectional view showing a semiconductor pertaining to another embodiment of the present invention.

The semiconductor device pertaining to the present invention is composed of a semiconductor element 1, a base 2 to support said semiconductor element, and an epoxy resin composition 3 to seal said semiconductor element, as shown in FIGS. 1 and 2. The epoxy resin composition covers only one side of the base on which the semiconductor element is supported. An adhesive layer 4 may be interposed between the semiconductor element 1 and the base 2, if necessary. The base 2 is usually composed of a base material 2a and a patterned metal wiring 2c (which is not shown in FIGS. 1 and 2). The base material 2a has electrically conductive parts 2b penetrating it for external communication. The semiconductor element 1 may be connected to the metal wiring 2c by lead wires 5.

The semiconductor device of the present invention is prepared in two steps. In the first step, a preparatory semiconductor device is prepared which is composed of a semiconductor element 1 and a base 2 supporting it. In the second step, the preparatory semiconductor device is sealed with an epoxy resin composition in a mold. The epoxy resin composition used for this purpose is usually in the form of powder or tablet. Sealing is accomplished by transfer-molding, injection-molding, or cast-molding the epoxy resin composition at 120–250° C., preferably 150–200° C. If necessary, molding may be followed by post-heat treatment at 150–180° C. for 2–16 hours.

In the present invention, the base material 2a is not specifically restricted but it should preferably be one which has good heat radiation properties and insulation properties so that it dissipates heat evolved by the semiconductor element during operation. A preferred material to meet this requirement is plastics, particularly polyimide. In addition, it should preferably be a flexible material that releases the internal stress of the semiconductor device.

The epoxy resin composition of the present invention should yield a cured product which has a flexural modulus lower than 10–30 GPa at 23° C. and a coefficient of linear expansion of $4 \times 10^{-6}$/K to $10 \times 10^{-6}$/K at 23° C. to glass transition point, with the product of the flexural modulus and the coefficient of linear expansion being lower than $2 \times 10^{-4}$ GPa/K, for good adhesion, low internal stress in the semiconductor device, and high reliability of the semiconductor device. A larger coefficient of linear expansion in the glassy state leads to semiconductor devices having excess warpage and poor thermal cycle properties and popcorn resistance. Conversely, a smaller coefficient of linear expansion leads to semiconductor devices which are liable to peeling at the interface between the resin and the base and are poor in thermal cycle properties. With a high flexural modulus, the epoxy resin composition is poor in adhesion to the base and semiconductor element. With a low flexural modulus, it is poor in workability. In the case where the flexural modulus is lower than 30 GPa at 23° C. and the coefficient of linear expansion is $4–10\times10^{-6}/K$ at 23° C. to glass transition point but the product of the flexural modulus and the coefficient of linear expansion is greater than $2\times10^{-4}$ GPa, the epoxy resin composition greatly warps the semiconductor device and is poor in adhesion.

To measure the above-mentioned modulus and coefficient of linear expansion, the cured product is prepared from the epoxy resin composition by transfer molding (followed by optional post-heating at 150–180° C. for 2–16 hours) so that epoxy groups undergo complete chemical reaction and final physical properties are acquired.

The epoxy resin (A) contained in the epoxy resin composition of the present invention is not specifically restricted so long as it has two or more epoxy groups per molecule. Examples of the epoxy resin include cresol novolak-type epoxy resin, phenol novolak-type epoxy resin, biphenyl-type epoxy resin, naphthalene-type epoxy resin, a variety of novolak-type epoxy resins synthesized from bisphenol-A, resorcinol, etc., linear aliphatic epoxy resin, alicyclic epoxy resin, heterocyclic epoxy resin, and halogenated epoxy resin. Of these examples, biphenyl-type epoxy resins are acceptable because of their good heat resistance and moisture resistance.

More than one kind of epoxy resin may be used in some applications. In such a case, it is desirable that a biphenyl-type epoxy resin accounts for more than 50% to ensure good heat resistance and good moisture resistance. The content of epoxy resin (A) in the epoxy resin composition of the present invention should be 2 to 15 wt %, preferably 2 to 12 wt %.

The hardener (B) contained in the epoxy resin composition of the present invention is not specifically restricted so long as it reacts with epoxy resin (A) for its curing. It includes, for example, phenol-novolak resin, cresol-novolak resin, phenol-aralkyl resin, phenolic resin containing the terpene skeleton, trihydroxyphenylmethane, novolak resins synthesized from bisphenol A, resorcinol, etc., resol resins, polyhydric phenolic resins (such as polyvinylphenol), maleic anhydride, phthalic anhydride, pyromellitic anhydride, and aromatic amines (such as m-phenylenediamine, diaminodiphenylmethane, and diaminodiphenylsulfone). Of these examples, phenol-novolak resin, phenol-aralkyl resin, and phenolic resin containing the terpene skeleton are acceptable because of their good adhesion, moisture resistance, reliability, moldability, and solder resistance, and the last one is most desirable.

The phenol-aralkyl resin is a phenol compound represented by the structural formula (I) below.

(I)

(where $R^1$ denotes a divalent aromatic group having no hydroxyl groups, $R^2$ denotes a divalent aromatic group having one or more hydroxyl groups, $R^3$ denotes a monovalent aromatic group having one or more hydroxyl groups, and n denotes zero or an integer of 1 or more.)

The phenolic resin having the terpene skeleton is a phenol compound or a polymer thereof with aldehyde represented by any of the structural formulas (II), (III), (IV), (V), (VI), and (VII) below, which has two or more aromatic groups separated by an alicyclic group, said aromatic groups each having a hydroxyl group connected directly thereto.

(II)

(III)

(where any hydrogen atom attached to the carbon atom may be replaced by a $C_{1-6}$ aliphatic or alicyclic group or halogen, such as methyl, ethyl, propyl, i-propyl, sec-butyl, tert-butyl, chlorine, and bromine).

(IV)

(V)

(VI)

(VII)

(where n denotes zero or an integer of 1 or more.)

More than one kind of hardener (B) may be used in combination. In such as a case, the preferred hardener (mentioned above) should account for more than 40 wt %, preferably more than 60 wt %.

In the present invention, the ratio between epoxy resin (A) and hardener (B) is not specifically restricted; however, a desirable ratio is such that the stoichiometric ratio of (A) to (B) is in the range of 0.5 to 1.5, particularly 0.8 to 1.2, so that the epoxy resin gives a cured product having good adhesion and mechanical properties.

In the present invention, any catalyst may be used to accelerate the cure reaction between epoxy resin (A) and hardener (B). Preferred examples of the catalyst include imidazole compounds (such as 2-methylimidazole, 2,4-dimethylimidazole, 2-methyl-4-methylimidazole, and 2-heptadecylimidazole), tertiary amine compounds (such as triethylamine, benzyldimethylamine, α-methylbenzyldimethylamine, 2-(dimethylamino)phenol, 2,4,6-tris(dimethylaminomethyl) phenol, 1,8-diazabicyclo(5.4.0)undecene-7, and 1,5-diazabicyclo(4.3.0)nonene-5), organometallic compounds (such as zirconium tetramethoxide, zirconium tetrapropoxide, tetrakis (acetylacetonato)zirconium, and tri(acetylacetonato) aluminum), and organic phosphine compounds (such as triphenylphosphine, trimethylphosphine, triethylphosphine, tributylphosphine, tri(p-methylphenyl)phosphine, tri (nonylphenyl)phosphine, triphenylphosphine-triphenylborane, and tetraphenyl phosphonium-tetraphenyl borate). Of these examples, triphenylphosphine, tetraphenylphosphonium-tetraphenyl borate, and 1,8-diazabicyclo(5.4.0)undecene-7 are particularly desirable. It is possible to use more than one catalyst in combination with one another. The amount of the catalyst should preferably be 0.01 to 10 parts by weight for 100 parts by weight of epoxy resin (A).

The epoxy resin composition of the present invention is incorporated with filler (C) selected from, amorphous silica, crystalline silica, calcium carbonate, magnesium carbonate, alumina, magnesia, clay, talc, calcium silicate, titanium oxide, antimony oxide, asbestos, glass fiber, and the like. Of these examples, amorphous silica is desirable because of its ability to lower the coefficient of linear expansion, thereby reducing stress. Amorphous silica is exemplified by fused silica and synthetic silica, in crushed form or spherical form.

In the present invention, the amount of filler (C) should be 85 to 95 wt %, preferably 87 to 93 wt %, for the total amount of the epoxy resin composition, from the standpoint of improvement in thermal cycle properties and popcorn resistance.

The epoxy resin composition of the present invention may be incorporated with a silane coupling agent or a titanate coupling agent. For higher reliability, incorporation with a coupling agent through filler surface pretreatment is recommended. Preferred silane coupling agents are those which have alkoxyl groups or hydrocarbon groups with functional groups (such as epoxy, amino, and mercapto) attached to the silicon atom. Amino silane coupling agents are desirable because of their ability to impart high fluidity to the epoxy resin composition.

In a preferred embodiment of the present invention, the epoxy resin composition may be incorporated with elastomer (D) to reduce the semiconductor device in warpage and stress. Examples of elastomer (D) include silicone rubber, olefin copolymers (such as EPR, EPDM, and SEBS), polybutadiene rubber, and modified silicone oil having substituent organic groups (such as epoxy, amino, hydroxyl, and carboxyl). Also, elastomer (D) may be replaced by a thermoplastic resin such as polyethylene.

A preferred example of elastomer (D) is a polyolefin having one or more functional groups containing oxygen atoms or nitrogen atoms. The functional groups contribute to adhesion to the base and improve the thermal cycle properties and popcorn resistance. Examples of such functional groups include epoxy group, hydroxyl group, carboxyl group, alkoxyl group, alkoxycarbonyl group, acid anhydride, amino group, and aminocarbonyl group. Examples of polyolefins having functional groups include SEBS modified with maleic anhydride, glycidyl methacrylate adduct of hydrogenated butadiene-styrene copolymer, EPR modified with maleic anhydride, ethylene-acrylic acid copolymer, ethylene-ethyl acrylate copolymer, ethylene-vinyl acetate copolymer, ethylene-methacrylic acid copolymer, and polybutadiene modified with acrylic acid. These polyolefins should be resilient at room temperature (or elastomers) because of their ability to improve the thermal cycle properties. The polyolefin having functional groups should be used in an amount of 0.1 to 10 wt %, preferably 0.2 to 5 wt %, for the total amount of the composition. The polyolefin having functional groups may be used in combination with a polyolefin having no functional groups, which includes, for example, polybutadiene, SEBS, and acrylic rubber.

According to the present invention, elastomer (D) in the epoxy resin composition also includes a silane-modified polymer in addition to the above-mentioned elastomer having functional groups. The silane-modified polymer should preferably be an addition polymer of polymerizable unsaturated compounds. In addition, it should preferably be one which has hydrolyzable groups (such as alkoxyl groups and carboxyl groups) or silanol groups (formed by hydrolysis of hydrolyzable groups) attached directly to the silicon atom.

The silane-modified polymer may be formed from such monomer as olefin (such as ethylene, propylene, 1-butene, 1-hexene, and 4-methyl-1-pentene), diene (such as butadiene and isoprene), unsaturated carboxylic acid (such as methacrylic acid and acrylic acid), unsaturated carboxylate (such as methyl (meth)acrylate, ethyl (meth)acrylate, and glycidyl (meth)acrylate), and aromatic vinyl (such as styrene and α-methylstyrene).

The silane compound to form the silane-modified polymer is not specifically restricted so long as it has a silicon atom in the molecule. The amount of silicon atoms should be in the range of 0.005–50 wt %, preferably 0.01–40wt %, and most desirably 0.05–30 wt %, of the amount of the silane-modified polymer.

The silane-modified polymer may be produced by copolymerizing a silicon-free monomer with a silicon-containing monomer or by grafting a silicon-free polymer with a silicon-containing compound. In the latter case, the original polymer includes polyethylene, ethylene-propylene copolymer (EPR), ethylene-propylene-diene copolymer (EPDM), styrene-butadiene-styrene block copolymer and a hydrogenated product thereof, ethylene-methacrylic acid copolymer, ethylene-glycidyl methacrylate copolymer, and ethylene-vinyl acetate copolymer.

The compound having a silicon atom includes, for example, γ-(meth)acryloxypropyltrimethoxysilane, γ-(meth)-acryloxypropyltriethoxysilane, and γ-(meth)acryloxypropyl-dimethylmethoxysilane (which are an ester formed from (meth) acrylic acid and an alcohol having alkoxysilyl groups), and vinyltrimethoxysilane, vinyltriethoxysilane, vinyltri(β-methoxyethoxy)silane, vinyltriacetoxysilane, and vinyldimethylmethoxysilane (which are a compound having a vinyl group attached directly to a silicon atom). Having polymerizable unsaturated bonds, these compounds copolymerize with the above-mentioned silicon-free monomer or graft on the above-mentioned original polymer to give the silane-modified polymer (to be used in the present invention). Grafting is accomplished by melt-mixing an original polymer, a compound having polymerizable unsaturated bonds, and a radical initiator in an extruder, kneader, or Banbury mixer. This reaction may also be accomplished in a solution.

In the case where the silicon-containing compound is γ-glycidoxypropyltrimethoxysilane or the like, which has an epoxy group, it is possible to utilize the epoxy group to perform addition reaction on an original polymer having amino groups or carboxyl groups as the structural units. In the case of a silicon compound having a hydrogen atom attached directly to a silicon atom, it is possible to add it directly to an original polymer having carbon—carbon unsaturated bonds as the structural units. It is also possible to produce the silane-modified polymer in the present invention by reacting a silicon compound having an amino group, carboxyl group, or mercapto group with an original polymer having functional groups capable of reaction with them.

The silane-modified polymer in the present invention should contain olefin (as the structural unit not containing silicon atoms) in an amount more than 1 wt %, preferably more than 20 wt %, most desirably more than 50 wt %. The silane-modified polymer should also contain, in addition to structural units derived from olefin, structural units derived from α,β-unsaturated carboxylate in an amount of 0.01–99 wt %, preferably 0.1–80 wt %, particularly 1–50 wt %.

The α,β-unsaturated carboxylate is usually an ester of acrylic acid or methacrylic acid, such as methyl (meth)acrylate, ethyl (meth)acrylate, isopropyl (meth)acrylate, n-butyl (meth)acrylate, isobutyl (meth)acrylate, t-butyl (meth)acrylate, and 2-ethylhexyl (meth)acrylate.

In the case where a polymerizable unsaturated compound having a silicon atom is grafted to an original polymer, the amount of grafting should be 0.001–100 wt %, preferably 0.01–50 wt %, particularly 0.1–30 wt %, depending on the structure.

The amount of the silane-modified polymer should be 0.01–40 wt %, preferably 0.1–30 wt %, more preferably 0.5–20 wt %, and most desirably 0.5–10 wt %, of the total amount of the epoxy resin composition. An insufficient amount leads to unsatisfactory adhesion, soldering heat resistance, and temperature cycling resistance. An excess amount leads to poor moldability and inadequate characteristic properties.

The epoxy resin composition containing the silane-modified compound as an essential ingredient is superior in heat resistance, moisture resistance, electrical properties, and adhesion. Therefore, it may be used for the conventional semiconductor device sealed on both upside and downside as well as the above-mentioned new semiconductor device sealed on only one side opposite to the base supporting a semiconductor element.

The epoxy resin composition of the present invention may optionally be incorporated with a flame retardant (such as phosphorus compound and halogen compound like halogenated epoxy resin), flame retardant auxiliary (such as antimony trioxide), coloring agent (such as carbon black and iron oxide), mold release (such as long-chain fatty acid, metal salt of long-chain fatty acid, ester of long-chain fatty acid, amide of long-chain fatty acid, and paraffin wax), and crosslinking agent (such as organic peroxide).

The epoxy resin composition of the present invention should preferably be prepared by melt-mixing the ingredients by using any known mixing machine such as Banbury mixer, kneader, roll, single- or twin-screw extruder, and cokneader. The mixing temperature is usually in the range of 70 to 150° C. After melt mixing, the resulting composition is formed into tablets for transfer molding to seal the semiconductor device.

EXAMPLES

The invention will be described in more detail with reference to the following examples, in which the composition and the amount of ingredients are expressed in terms of parts by weight.

Examples 1 to 5 and Comparative Examples 1 to 4

Ingredients shown in Tables 1 and 2 were dryblended by using a mixer according to the formulation shown in Table 3. The resulting dryblend was mixed for 5 minutes by using a mixing mill (with the roll surface temperature kept at 90° C.). After cooling, the mixture was crushed to give the desired epoxy resin composition.

TABLE 1

| | | | |
|---|---|---|---|
| Epoxy resin | I | 4,4'-bis(2,3-epoxypropoxy)-3,3',5,5-tetramethylbiphenyl | See Tables 2, 4, and 6 |
| Hardener | I | Phenolaralkyl resin (OH equivalent = 175) | for formulation. |
| | II | Phenol novolak resin (OH equivalent = 107) | |
| | III | Polyhydric phenol compound containing terpene skeleton (OH equivalent = 175, solution viscosity = 70 cst, in 60% methanol solution at 25° C.); Structural formula (VI) | |
| | IV | Difunctional phenol compound containing terpene skeleton; Structural formula (VII) | |
| | V | Trishydroxyphenylmethane (OH equivalent = 97) | |

TABLE 1-continued

| | | | |
|---|---|---|---|
| Inorganic filler | I | Crushed fused silica having an average particle diameter of 7 μm | |
| | II | Spherical fused silica having an average particle diameter of 13 μm | |
| | III | Spherical fused silica having an average particle diameter of 1 μm | |
| Cure accelerator | I | Triphenylphosphine | |
| Polymer (elastomer) | I | Kraton G1652 (SEBS), Shell Chemical Company | |
| | II | Flowbeads HE-5023 (polyethylene), Sumitomo Seika Company | |
| | III | Ethylene-butene-1 copolymer modified with maleic anhydride (2%) | |
| | IV | Ethylene-glycidyl methacrylate copolymer (E/GMA = 94/6) | |
| | V | Maleic anhydride-modified ethylene-ethyl acrylate copolymer (ethyl acrylate = 30%) | |
| | VI | Ethylene-ethyl acrylate copolymer (ethyl acrylate = 35%) | |
| | VII | Ethylene-vinyl acetate copolymer (vinyl acetate = 41%) | |
| | VIII | Ethylene-acrylic acid copolymer | |
| Mold release | | Carnauba wax | 0.3% |
| Flame retardant | | Brominated bisphenol A-type epoxy resin (epoxy equivalent = 400, bromine content = 49 wt %) | 0.2% |
| Flame retardant auxiliary | | Antimony trioxide | 0.3% |
| Coloring agent | | Carbon black | 0.2% |
| Silane coupling agent | | N-phenyl-γ-aminopropyltrimethoxysilane | 1.0% |

TABLE 2

| | Epoxy resin | Hardener Type | Hardener Amount | Filler Type | Filler Amount | Cure accelerator Amount | Stress depressant Type | Stress depressant Amount |
|---|---|---|---|---|---|---|---|---|
| Example 1 | 6.3 | II | 3.5 | I/II/III | 4.3/74.5/8.3 | 0.1 | I | 1.0 |
| Example 2 | 3.3 | I | 3.0 | II/III | 81.1/10.0 | 0.05 | I | 0.5 |
| Example 3 | 2.3 | I | 2.1 | II/III | 80.0/11.5 | 0.03 | II | 2.0 |
| Example 4 | 3.5 | I | 3.3 | II/III | 80.1/10.0 | 0.06 | I | 1.0 |
| Example 5 | 4.6 | II | 4.3 | II/III | 80.1/8.9 | 0.06 | — | 0.0 |
| Comparative Example 1 | 3.6 | I | 3.3 | II/III | 80.1/10.9 | 0.05 | — | 0.0 |
| Comparative Example 2 | 8.7 | II | 4.9 | I/II/III | 4.2/69.7/8.5 | 0.2 | — | 0.0 |
| Comparative Example 3 | 1.1 | I | 1.0 | II/III | 83.8/9.0 | 0.02 | I | 3.0 |
| Comparative Example 4 | 6.9 | II | 3.8 | I/III | 71.8/15.4 | 0.1 | II | 0.5 |

The resulting resin composition underwent low-pressure transfer molding at 175° C. and 7 MPa and with a cycle time of 2 minutes, which was followed by post-curing at 180° C. for 5 hours. The specimens were tested for flexural modulus and linear expansion coefficient. The flexural modulus was calculated from the load-deflection curve in the three-point bending test at room temperature. The linear expansion coefficient is an average value obtained from the thermal expansion curve (between 23° C. and glass transition point) by TMA. The results are shown in Table 3.

Figure 3:
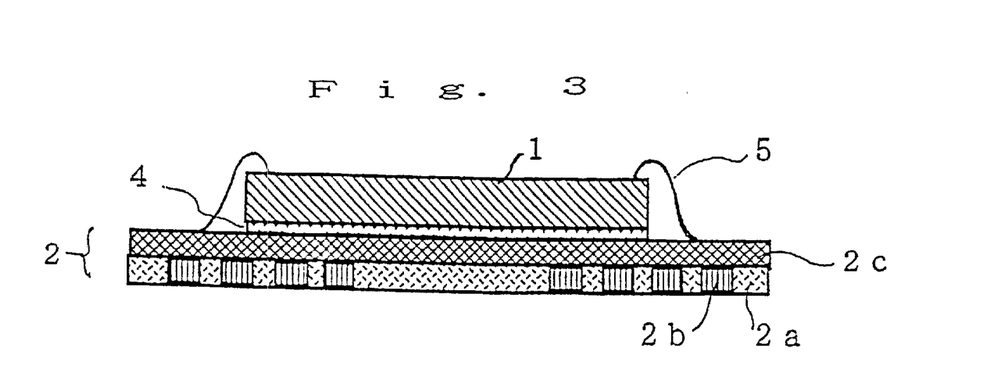
FIG. 3 is a schematic sectional view showing a preparatory semiconductor device used in the example of the present invention.

The resin composition underwent transfer molding and post-curing under the same conditions as above, with the mold containing the preparatory semiconductor device shown in FIG. 3. Thus there was obtained an imitation semiconductor device as shown in FIG. 2. It is made up of a semiconductor element 1, a base 2 of polyimide (PI) film to support said semiconductor element, and an epoxy resin composition 3 to seal said semiconductor element. It has the following dimensions.

Semiconductor element 1: 7×7×0.5 mm
Adhesive layer 4: 0.1 mm thick
Epoxy resin 3: 20×20×1.0 mm
Metal wiring 2c: 0.1 mm thick
Base: 0.15 mm thick The imitation semiconductor device was tested for physical properties in the following manner.

PI film peel strength: On the PI film was molded a rectangular prism, measuring 10 mm long, 10 mm wide, 5 mm high, in the above-mentioned manner. The peel strength was measured by the 180° peel test. The result of this test indicates the magnitude of adhesion between the base and the sealing resin.

Package warpage: The flat part of the imitation semiconductor device was examined for surface irregularities (along the diagonal) by using a surface roughness meter. The vertical distance between the highest point and the lowest point was measured.

Thermal cycle properties: Twenty imitation semiconductor devices were allowed to stand sequentially at −65° C. for 30 min, at room temperature for 10 min, at 150° C. for 30 min, and at room temperature for 10 min in 1 cycles. The test pieces were disassembled and examined for cracking in the resin and semiconductor element to count the failure rate.

Popcorn test: Twenty imitation semiconductor devices were moistened at 85° C. and 85% RH for 48 hours and then heated in an, IR reflow furnace at 245° C. (max). The test pieces were visually examined for the peeling of resin from the PI film base of the semiconductor to count the failure rate.

The results of measurements are shown in Table 3.

outside the range specified in the present invention) and is superior in adhesion but is poor in warpage, popcorn resistance, and thermal cycle properties. In Comparative Example 4, the package has a coefficient of linear expansion of $3 \times 10^{-6}$/K and is small in warpage and good in thermal cycle properties but is poor in adhesion and popcorn resistance. In Comparative Example 4, the package has a value of $2.05 \times 10^{-4}$ GPa/K for (flexural modulus)×(coefficient of linear expansion) and is poor in all the properties.

TABLE 3

|  | Flexural modulus at room temperature (GPa) (A) | Coefficient of linear expansion ($\times 10^{-6}$/K) (B) | A × B ($\times 10^{-4}$ GPa/K) | Peel strength of PI film (kg/10 mm) | Warpage of package ($\mu$m) | Thermal cycle (failure rate) | Popcorn test (failure rate) |
|---|---|---|---|---|---|---|---|
| Example 1 | 20.0 | 8 | 1.6 | 0.6 | 42 | 0/20 | 0/20 |
| Example 2 | 29.0 | 5 | 1.45 | 0.5 | 38 | 0/20 | 0/20 |
| Example 3 | 28.3 | 7 | 1.981 | 0.6 | 39 | 0/20 | 0/20 |
| Example 4 | 23.0 | 6 | 1.38 | 0.5 | 40 | 0/20 | 0/20 |
| Example 5 | 25.0 | 6 | 1.50 | 0.5 | 43 | 0/20 | 0/20 |
| Comparative Example 1 | 31.0 | 5 | 1.55 | 0.2 | 40 | 15/20 | 10/20 |
| Comparative Example 2 | 12.0 | 11 | 1.32 | 0.5 | 110 | 20/20 | 20/20 |
| Comparative Example 3 | 29.5 | 3 | 0.885 | 0.1 | 50 | 3/20 | 15/20 |
| Comparative Example 4 | 20.5 | 10 | 2.05 | 0.4 | 95 | 20/20 | 18/20 |

It is noted from Table 3 that the epoxy resin composition and resin-sealed semiconductor device of the present invention are superior in adhesion, low package warpage, thermal cycle properties, and popcorn resistance. In Comparative Example 1, the package has a flexural modulus higher than 30 GPa and is small in warpage but is poor in other properties. In Comparative Example 2, the package has a coefficient of linear expansion of $11 \times 10^{-6}$/K (which is Examples 6 to 10 and Comparative Examples 5 to 8

The same procedure as in Examples 1 to 5 was repeated except that the epoxy resin composition was changed in formulation as shown in Table 4. The results are shown in Table 5.

TABLE 4

|  | Epoxy resin | Hardener | | Filler | | Cure accelerator | Stress depressant | |
|---|---|---|---|---|---|---|---|---|
|  |  | Type | Amount | Type | Amount | Amount | Type | Amount |
| Example 6 | 6.0 | III/V | 2.0/1.8 | I/II/III | 4.3/74.5/8.3 | 0.1 | I | 1.0 |
| Example 7 | 3.3 | III | 3.0 | II/III | 81.1/10.0 | 0.05 | I | 0.5 |
| Example 8 | 2.6 | IV/II | 1.3/0.5 | II/III | 80.0/11.5 | 0.03 | II | 2.0 |
| Example 9 | 4.2 | IV/V | 2.0/0.7 | II/III | 80.1/10.0 | 0.06 | I | 1.0 |
| Example 10 | 4.6 | III | 4.3 | II/III | 80.1/8.9 | 0.06 | — | 0.0 |
| Comparative Example 5 | 3.9 | IV/II | 2.0/0.7 | II/III | 80.1/10.9 | 0.05 | — | 0.0 |
| Comparative Example 6 | 8.3 | IV/V | 3.9/1.4 | I/II/III | 4.2/69.7/8.5 | 0.2 | — | 0.0 |
| Comparative Example 7 | 1.1 | III | 1.0 | II/III | 83.8/9.0 | 0.02 | I | 3.0 |
| Comparative Example 8 | 6.3 | IV/II | 3.2/1.2 | I/III | 71.8/15.4 | 0.1 | II | 0.5 |

TABLE 5

|  | Flexural modulus at room temperature (GPa) (A) | Coefficient of linear expansion (×10⁻⁶/K) (B) | A × B (×10⁻⁴ GPa/K) | Peel strength of PI film (kg/10 mm) | Warpage of package (μm) | Thermal cycle (failure rate) | Popcorn test (failure rate) |
|---|---|---|---|---|---|---|---|
| Example 6 | 20.0 | 8 | 1.60 | 0.6 | 42 | 0/20 | 0/20 |
| Example 7 | 29.0 | 5 | 1.45 | 0.5 | 38 | 0/20 | 0/20 |
| Example 8 | 28.3 | 7 | 1.981 | 0.6 | 39 | 0/20 | 0/20 |
| Example 9 | 23.0 | 6 | 1.38 | 0.5 | 40 | 0/20 | 0/20 |
| Example 10 | 25.0 | 6 | 1.50 | 0.5 | 43 | 0/20 | 0/20 |
| Comparative Example 5 | 31.0 | 5 | 1.55 | 0.2 | 40 | 15/20 | 10/20 |
| Comparative Example 6 | 12.0 | 11 | 1.32 | 0.5 | 110 | 20/20 | 20/20 |
| Comparative Example 7 | 29.5 | 3 | 0.885 | 0.1 | 50 | 3/20 | 15/20 |
| Comparative Example 8 | 20.5 | 10 | 2.05 | 0.4 | 95 | 20/20 | 18/20 |

It is noted from Table 5 that the epoxy resin composition and resin-sealed semiconductor device of the present invention are superior in adhesion, low package warpage, thermal cycle properties, and popcorn resistance. In Comparative Example 5, the package, which does not contain the hardener specified in the present invention, is poor in adhesion, thermal cycle properties, and popcorn resistance. In Comparative Example 6, the package, which contains a less amount of inorganic filler than specified in the present invention, is poor in warpage, popcorn resistance, and thermal cycle properties although it is superior in adhesion.

Examples 11 to 16 and Comparative Examples 9 to 12

The same procedure as in Examples 1 to 5 was repeated except that the epoxy resin composition was changed in formulation as shown in Table 6. The results are shown in Table 7.

TABLE 6

|  | Epoxy resin | Hardener | | Filler | | Cure accelerator Amount | Stress depressant | |
|---|---|---|---|---|---|---|---|---|
|  |  | Type | Amount | Type | Amount |  | Type | Amount |
| Example 11 | 6.0 | III/V | 2.0/1.8 | I/II/III | 4.3/74.5/8.3 | 0.1 | III/I | 0.7/0.3 |
| Example 12 | 3.3 | III | 3.0 | II/III | 81.1/10.0 | 0.05 | IV | 0.5 |
| Example 13 | 2.6 | IV/II | 1.3/0.5 | II/III | 80.0/11.5 | 0.03 | V/I | 1.5/0.5 |
| Example 14 | 4.2 | IV/V | 2.0/0.7 | II/III | 80.1/10.0 | 0.06 | VI | 1.0 |
| Example 15 | 4.1 | IV/II | 2.1/0.8 | II/III | 80.1/8.9 | 0.06 | VII | 1.0 |
| Example 16 | 2.9 | IV/V | 1.4/0.5 | II/III | 81.1/10.0 | 0.05 | VIII/I | 1.0/1.0 |
| Comparative Example 9 | 3.9 | IV/II | 2.0/0.7 | II/III | 80.1/10.9 | 0.05 | — | 0.0 |
| Comparative Example 10 | 8.3 | IV/V | 3.9/1.4 | I/II/III | 4.2/69.7/8.5 | 0.2 | II | 0.5 |
| Comparative Example 11 | 1.1 | III | 1.0 | II/III | 83.8/9.0 | 0.02 | I | 2.0 |
| Comparative Example 12 | 6.3 | IV/II | 3.2/1.2 | I/III | 71.8/15.4 | 0.1 | II | 0.5 |

TABLE 7

|  | Flexural modulus at room temperature (GPa) (A) | Coefficient of linear expansion (×10⁻⁶/K) (B) | A × B (×10⁻⁴ GPa/K) | Peel strength of PI film (kg/10 mm) | Warpage of package (μm) | Thermal cycle (failure rate) | Popcorn test (failure rate) |
|---|---|---|---|---|---|---|---|
| Example 11 | 20.0 | 9 | 1.80 | 1.2 | 42 | 0/20 | 0/20 |
| Example 12 | 29.0 | 5 | 1.45 | 0.8 | 38 | 0/20 | 0/20 |
| Example 13 | 27.0 | 6 | 1.62 | 0.9 | 39 | 0/20 | 0/20 |
| Example 14 | 28.3 | 6 | 1.698 | 0.8 | 40 | 0/20 | 0/20 |
| Example 15 | 24.3 | 7 | 1.701 | 1.0 | 42 | 0/20 | 0/20 |
| Example 16 | 26.0 | 5 | 1.30 | 0.9 | 45 | 0/20 | 0/20 |
| Comparative Example 9 | 31.0 | 5 | 1.55 | 0.2 | 40 | 15/20 | 10/20 |
| Comparative Example 10 | 12.0 | 11 | 1.32 | 0.5 | 110 | 20/20 | 20/20 |

TABLE 7-continued

|  | Flexural modulus at room temperature (GPa) (A) | Coefficient of linear expansion (×10⁻⁶/K) (B) | A × B (×10⁻⁴ GPa/K) | Peel strength of PI film (kg/10 mm) | Warpage of package ($\mu$m) | Thermal cycle (failure rate) | Popcorn test (failure rate) |
|---|---|---|---|---|---|---|---|
| Comparative Example 11 | 29.5 | 3 | 0.885 | 0.1 | 50 | 3/20 | 15/20 |
| Comparative Example 12 | 20.5 | 10 | 2.05 | 0.4 | 95 | 20/20 | 18/20 |

It is noted from Table 7 that the epoxy resin composition and resin-sealed semiconductor device of the present invention are superior in adhesion, low package warpage, thermal cycle properties, and popcorn resistance. By contrast, Comparative Examples 9 to 12, the packages are poor in adhesion, warpage, thermal cycle properties, and popcorn resistance.

Examples 17 to 22 and Comparative Examples 13 to 17

The same procedure as in Examples 1 to 5 was repeated except that the epoxy resin composition was compounded from ingredients shown in Table 8 according to the formulation shown in Table 9. The results are shown in Table 10.

TABLE 8

| Epoxy resin | | 4,4'-bis(2,3-epoxypropoxy)-3,3',5,5'-tetramethylbiphenyl | See Table 9 for formulation. |
|---|---|---|---|
| Hardener | I | Polyhydric phenol having terpene skeleton represented by formula (VI) (OH equivalent = 175, solution viscosity = 70 cst in 60% methanol solution) | |
| | II | Difunctional phenol compound having terpene skeleton represented by formula (VII) | |
| | III | Phenol novolak resin having an OH equivalent of 175 | |
| | IV | Trishydroxyphenylmethane having an OH equivalent of 97 | |
| Inorganic filler | I | Crushed fused silica having an average particle diameter of 7 $\mu$m | |
| | II | Crushed fused silica having an average particle diameter of 13 $\mu$m | |
| | III | Spherical fused silica having an average particle diameter of 1 $\mu$m | |
| Cure accelerator | I | Triphenylphosphine | |
| Polymer (elastomer) | I | SEBS, (styrene/butadiene = 30/70 by weight, number-average molecular weight = 80,000) | |
| | II | Ethylene-ethyl acrylate copolymer (ethyl acrylate content = 30 wt %, MFR = 25 g/10 min at 190° C. and 2160 gf of load) | |
| | III | 95 wt % graft-modified polymer obtained by extrusion melting and mixing from 100 pbw of polymer II, 0.3 pbw of $\gamma$-methacryloxypropyltrimethoxysilane, and 0.2 pbw of 2,5-dimethyl-2,5-bis(t-butylperoxy)hexane | |
| | IV | 93 wt % graft-modified polymer obtained by extrusion melting and mixing from 100 pbw of polymer II, 1.5 pbw of $\gamma$-methacryloxypropyltrimethoxysilane, and 0.2 pbw of 2,5-dimethyl-2,5-bis(t-butylperoxy)hexane | |
| Mold release | | Carnauba wax | 0.2% |
| Flame retardant | | Brominated bisphenol A-type epoxy resin (epoxy equivalent = 400, bromine content = 49 wt %) | 0.8% |
| Flame retardant auxiliary | | Antimony trioxide | 1.0% |
| Coloring agent | | Carbon black | 0.3% |
| Silane coupling agent | | $\gamma$-glycidoxypropyltrimethoxysilane | 1.0% |

TABLE 9

| | Epoxy resin | Hardener | | Inorganic filler | | Cure accelerator Amount | Polymer | |
|---|---|---|---|---|---|---|---|---|
| | | Type | Amount | Type | Amount | | Type | Amount |
| Example 17 | 5.0 | I | 4.92 | I/II/III | 4/75/8 | 0.08 | III | 1.0 |
| Example 18 | 4.4 | II/III | 2/1.05 | II/III | 81/10 | 0.05 | IV | 0.5 |
| Example 19 | 3.3 | II/IV | 1.4/0.75 | II/III | 80/11 | 0.05 | I/III | 0.5/1.0 |
| Example 20 | 4.4 | I/IV | 2.34/1.0 | II/III | 80/9 | 0.06 | II/IV | 0.2/1.0 |
| Example 21 | 5.7 | I/IV | 3.1/1.1 | II/III | 78/8 | 0.1 | I/IV | 0.5/1.5 |
| Example 22 | 2.77 | II/IV | 1.4/0.5 | II/III | 83/10 | 0.03 | II/III | 0.2/0.8 |

TABLE 9-continued

|  | Epoxy resin | Hardener Type | Hardener Amount | Inorganic filler Type | Inorganic filler Amount | Cure accelerator Amount | Polymer Type | Polymer Amount |
|---|---|---|---|---|---|---|---|---|
| Comparative Example 13 | 4.1 | II/III | 2/1.05 | II/III | 81/10 | 0.05 | — | — |
| Comparative Example 14 | 4.4 | II/III | 2/1.05 | II/III | 81/10 | 0.05 | I | 0.5 |
| Comparative Example 15 | 2.1 | II/IV | 0.89/0.48 | II/III | 84/10 | 0.03 | I | 0.5 |
| Comparative Example 16 | 9.7 | I/IV | 5.3/1.7 | I/II/III | 20/55/5 | 0.1 | I | 1.0 |
| Comparative Example 17 | 7.0 | I/IV | 3.7/1.7 | II/III | 78/7 | 0.1 | I | 0.5 |

TABLE 10

|  | Flexural modulus at room temperature (GPa) (A) | Coefficient of linear expansion ($\times 10^{-6}$/K) (B) | A × B ($\times 10^{-4}$ GPa/K) | Peel strength of PI film (kg/10 mm) | Warpage of package ($\mu$m) | Thermal cycle (failure rate) | Popcorn test (failure rate) |
|---|---|---|---|---|---|---|---|
| Example 17 | 19.5 | 8 | 1.76 | 1.70 | 38 | 0/20 | 0/20 |
| Example 18 | 29.0 | 6 | 1.74 | 1.0 | 30 | 0/20 | 0/20 |
| Example 19 | 27.0 | 6 | 1.62 | 1.80 | 27 | 0/20 | 0/20 |
| Example 20 | 25.5 | 7 | 1.79 | 1.75 | 30 | 0/20 | 0/20 |
| Example 21 | 18.5 | 9 | 1.67 | 1.83 | 33 | 0/20 | 0/20 |
| Example 22 | 29.5 | 4 | 1.18 | 1.65 | 29 | 0/20 | 0/20 |
| Comparative Example 13 | 32.0 | 6 | 1.92 | 0.4 | 98 | 20/20 | 18/20 |
| Comparative Example 14 | 30.3 | 6 | 1.82 | 0.5 | 72 | 20/20 | 17/20 |
| Comparative Example 15 | 39.0 | 2 | 0.78 | 0.05 | 29 | 20/20 | 20/20 |
| Comparative Example 16 | 15.0 | 12 | 1.8 | 0.8 | 65 | 20/20 | 20/20 |
| Comparative Example 17 | 24.5 | 10 | 2.45 | 0.5 | 89 | 20/20 | 20/20 |

It is noted from Table 10 that the epoxy resin composition and resin-sealed semiconductor device of the present invention are superior in adhesion, low package warpage, thermal cycle properties, and popcorn resistance. By contrast, comparative samples which employ the polyolefin without the functional group specified in the present invention are poor in adhesion, warpage, thermal cycle properties, and popcorn resistance.

Examples 23 to 31 and Comparative Examples 18 to 25

Epoxy resin compositions were prepared in the same manner as in Examples 1 to 5 from ingredients shown in Table 11 according to the formulation shown in Table 12.

TABLE 11

| Epoxy resin | I | 4,4'-bis(2,3-epoxypropoxy)-3,3',5,5-tetramethylbiphenyl | See Table 12 for formulation. |
|---|---|---|---|
| Hardener | I | Phenol novolak resin having an OH equivalent of 107 | |
|  | II | Phenol aralkyl resin (OH equivalent = 175) represented by formula (I) | |
|  | III | Polyhydric phenol compound having terpene skeleton represented by formula (VI) (OH equivalent = 175, solution viscosity = 70 cst, 60% methanol solution at 25° C. | |
|  | IV | Difunctional phenol compound having terpene skeleton represented by formula (VII) | |
| Inorganic filler | I | Crushed fused silica having an average particle diameter of 14 $\mu$m | |
|  | II | Crushed fused silica having an average particle diameter of 7 $\mu$m | |
|  | III | Spherical fused silica having an average particle diameter of 30 $\mu$m | |
|  | IV | Spherical fused silica having an average particle diameter of 12 $\mu$m | |

TABLE 11-continued

|  |  |  |  |
|---|---|---|---|
|  | V | Spherical fused silica having an average particle diameter of 1 μm |  |
| Cure accelerator | I | Triphenylphosphine |  |
|  | II | 1,8-diazabicyclo(5.4.0)undecene-7 |  |
| Polymer (elastomer) | I | SEBS, (styrene/butadiene = 30/70 by weight, number-average molecular weight = 80,000) |  |
|  | II | Ethylene-ethyl acrylate copolymer (ethyl acrylate content = 30 wt %, MFR = 25 g/10 min at 190° C. and 2160 gf of load) |  |
|  | III | 95 wt % graft-modified polymer obtained by extrusion melting and mixing from 100 pbw of polymer II, 0.3 pbw of γ-methacryloxypropyltrimethoxysilane, and 0.2 pbw of 2,5-dimethyl-2,5-bis(t-butylperoxy) hexane |  |
|  | IV | 93 wt % graft-modified polymer obtained by extrusion melting and mixing from 100 pbw of polymer II, 1.5 pbw of γ-methacryloxypropyltrimethoxysilane, and 0.2 pbw of 2,5-dimethyl-2,5-bis(t-butylperoxy)hexane |  |
| Mold release |  | Carnauba wax | 0.2% |
| Flame retardant |  | Brominated bisphenol A-type epoxy resin (epoxy equivalent = 400, bromine content = 49 wt %) | 0.8% |
| Flame retardant auxiliary |  | Antimony trioxide | 1.0% |
| Coloring agent |  | Carbon black | 0.3% |
| Silane coupling agent |  | γ-glycidoxypropyltrimethoxysilane | 1.0% |

TABLE 12

|  | Epoxy resin | | Hardener | | Inorganic filler | | Polymer | | Accelerator | |
|---|---|---|---|---|---|---|---|---|---|---|
|  | Type | % | Type | % | Type | % | Type | % | Type | % |
| Example |  |  |  |  |  |  |  |  |  |  |
| 23 | I | 3.8 | II | 3.8 | IV<br>V | 80<br>8 | III | 1 | I | 0.1 |
| 24 | I | 2.5 | II | 2.6 | IV<br>V | 85<br>6 | IV | 0.5 | II | 0.1 |
| 25 | I | 5.9 | III | 5.7 | III<br>V | 75<br>7 | III | 3 | I | 0.1 |
| 26 | I | 2.4 | I<br>IV | 0.8<br>1.1 | IV<br>V | 86<br>6 | III | 0.3 | I | 0.1 |
| 27 | I | 4.9 | II<br>IV | 2.1<br>2.6 | III<br>V | 80<br>6 | IV | 1 | I | 0.1 |
| 28 | I | 6.8 | III | 6.25 | I<br>V | 75<br>5 | IV | 3.5 | II | 0.15 |
| 29 | I | 11.7 | III | 10.85 | II<br>V | 65<br>5 | I<br>III | 1<br>3 | I | 0.15 |
| 30 | I | 14.3 | III<br>IV | 5.6<br>6.6 | II<br>V | 60<br>5 | I<br>IV | 2<br>3 | II | 0.2 |
| 31 | I | 10.4 | I<br>IV | 3.6<br>4.55 | II<br>III<br>V | 35<br>35<br>5 | II<br>III | 1<br>2 | I | 0.15 |
| Comparative Example |  |  |  |  |  |  |  |  |  |  |
| 18 | I | 4.3 | II | 4.3 | IV<br>V | 80<br>8 |  |  | I | 0.1 |
| 19 | I | 3.8 | II | 3.8 | IV<br>V | 80<br>8 | I | 1 | I | 0.1 |
| 20 | I | 3.8 | II | 3.8 | IV<br>V | 80<br>8 | II | 1 | I | 0.1 |
| 21 | I | 2.75 | II | 2.85 | IV<br>V | 85<br>6 |  |  | II | 0.1 |
| 22 | I | 2.5 | II | 2.6 | IV<br>V | 85<br>6 | II | 0.5 | II | 0.1 |
| 23 | I | 11.7 | III | 10.85 | II<br>V | 65<br>5 | I<br>II | 1<br>3 | I | 0.15 |
| 24 | I | 14.3 | III<br>IV | 5.6<br>6.6 | II<br>V | 60<br>5 | I<br>II | 2<br>3 | II | 0.2 |
| 25 | I | 10.4 | I<br>IV | 3.6<br>4.55 | II<br>III<br>V | 35<br>35<br>5 | II | 3 | I | 0.15 |

Each of the epoxy resin compositions prepared as mentioned above underwent low-pressure transfer molding (at 175° C. for 2 minutes) to seal the upper and lower sides of a semiconductor device (IC specified below) in the conventional manner.

Package: 176-pin QFP

Package size: 24×24×1.4 mm

Lead frame: copper

Chip: imitation semiconductor chip having aluminum wiring and polyimide coating

Chip size: 12×12 (mm)

After post-curing at 180° C. for 5 hours, the resulting IC package was tested as follows:

Solder heat resistance: The sample was moistened at 85° C. and 85% RH for 120 hours and then heated in an IR reflow furnace at 245° C. (max). The surface of the chip and the reverse of the stage were examined for peeling by using an ultrasonic detector.

Moisture resistance reliability: After heating in an IR reflow furnace, the samples underwent pressure cooker test at 125° C. and 100% RH. Time required for the cumulative failure rate (due to wire breakage) reaches 50% was regarded as the life.

Thermal cycle properties: After heating in an IR reflow furnace, the samples were allowed to stand sequentially at low temperature (−65° C.) for 30 min, at 23° C. for 10 min, at high temperature (+150° C.) for 30 min, and at 23° C. for 10 min in 500 cycles. The surface of the chip and the reverse of the stage were examined for peeling by using an ultrasonic detector. The results are shown in Table 13.

TABLE 13

| | Solder heat resistance* | | Moisture resistance reliability PCT life (h) | Thermal cycle resistance** | |
|---|---|---|---|---|---|
| | Chip surface | Stage reverse | | Chip surface | Stage reverse |
| Example 23 | 0 | 0 | >500 | 0 | 0 |
| Example 24 | 0 | 0 | >500 | 0 | 0 |
| Example 25 | 0 | 0 | >500 | 0 | 0 |
| Example 26 | 0 | 0 | >500 | 0 | 0 |
| Example 27 | 0 | 0 | >500 | 0 | 0 |
| Example 28 | 0 | 0 | >500 | 0 | 0 |
| Example 29 | 0 | 0 | >500 | 0 | 0 |
| Example 30 | 0 | 0 | >500 | 0 | 0 |
| Example 31 | 0 | 0 | >500 | 0 | 0 |
| Comparative Example 18 | 0 | 33 | 450 | 3 | 20 |
| Comparative Example 19 | 0 | 16 | 460 | 1 | 20 |
| Comparative Example 20 | 0 | 15 | 460 | 1 | 20 |
| Comparative Example 21 | 2 | 35 | 410 | 4 | 20 |
| Comparative Example 22 | 0 | 17 | 450 | 1 | 20 |
| Comparative Example 23 | 8 | 40 | 120 | 7 | 20 |
| Comparative Example 24 | 13 | 40 | 96 | 15 | 20 |
| Comparative Example 25 | 7 | 40 | 144 | 8 | 20 |

*Number of failures out of 40 samples.
**Number of failures out of 20 samples.

It is noted from Table 13 that the epoxy resin composition (in examples) pertaining to the present invention did not peel in the solder heat test and heat resistance cycle test and had a life longer than 500 hours in the moisture resistance reliability test that followed the solder heat test. By contrast, the comparative epoxy resin compositions not containing the silane-modified polymer pertaining to the present invention are poor in solder heat resistance, heat resistance cycle test, and moisture resistance reliability test.

What is claimed is:

1. A semiconductor device comprising a semiconductor element, a base to support said semiconductor element, and an epoxy resin composition covering only one side opposite the base, wherein said epoxy resin composition comprises: (A) epoxy resin, (B) hardener, and (C) inorganic filler, and giving a cured product which has (a) a flexural modulus of elasticity of 10 to 30 Gpa at 23° C. and (b) a coefficient of linear expansion of $4\times10^{-6}$/K to $10\times10^{-6}$/K in the temperature range from 23° to the glass transition point, with the product of (a) and (b) being smaller than $2\times10^{-4}$ Gpa/K.

2. The semiconductor device as defined in claim 1, wherein the hardener (B) is a phenol compound represented by the structural formula (I) below (I)

where $R^1$ denotes a divalent aromatic group having no hydroxyl groups, $R^2$ denotes a divalent aromatic group having one or more hydroxyl groups, $R^3$ denotes a monovalent aromatic group having one or more hydroxyl groups, and n denotes a non-negative integer.

3. The semiconductor device as defined in claim 1, wherein the hardener (B) is a phenol compound having two or more aromatic groups separated by an alicyclic group, said aromatic groups each having a hydroxyl group connected directly thereto.

4. The semiconductor as defined in claim 2, wherein the hardener (B) is a phenol compound represented by the structural formula (II) or (III) below or a polymer thereof with aldehyde (II)

(III)

where the hydrogen attached to the carbon atom may be replaced by an aliphatic or alicyclic group having 1 to 6 carbon atoms.

5. The semiconductor device as defined in claim 1, further comprising (D) an elastomer.

6. The semiconductor device as defined in claim 5, wherein the elastomer (D) is a polyolefin having one or more functional groups containing oxygen atoms or nitrogen atoms.

7. The semiconductor device as defined in claim 5, wherein the elastomer (D) contains a silane-modified polymer.

8. The semiconductor device as defined in claim 5, wherein the elastomer (D) is a silane-modified polymer formed by grafting a copolymer of ethylene and α,β-unsaturated carboxylic ester with a polymerizable unsaturated compound having a a silicon atom in the molecule, said copolymer containing structural units derived from an α, β-unsaturated carboxylic acid in an amount of 0.01 to 99 wt %.

9. The semiconductor device as defined in claim 1, wherein the epoxy resin (A) is a biphenyl epoxy resin having a biphenyl skeleton.

10. The semiconductor device as defined in claim 5, wherein epoxy resin (A) accounts for 0.1 to 65 wt %, hardener (B) accounts for 0.1 to 65 wt %, inorganic filler (C) accounts for 30 to 96 wt %, and elastomer (D) accounts for 0.01 to 40 wt %.

11. The semiconductor device as defined in claim 5, wherein epoxy resin (A) accounts for 0.01 to 65 wt %, hardener (B) accounts for 0.1 to 65 wt %, inorganic filler (C) accounts for 85 to 96 wt %, and elastomer (D) accounts for 0.01 to 40 wt %.

* * * * *